United States Patent [19]

Inoue

[11] 4,176,206
[45] Nov. 27, 1979

[54] METHOD FOR MANUFACTURING AN OXIDE OF SEMICONDUCTOR

[75] Inventor: Makoto Inoue, Yokohama, Japan

[73] Assignee: Sony Corporation, Tokyo, Japan

[21] Appl. No.: 747,256

[22] Filed: Dec. 2, 1976

[30] Foreign Application Priority Data

Dec. 13, 1975 [JP] Japan .................................. 50-150011

[51] Int. Cl.² ............................................ B05D 5/12
[52] U.S. Cl. .................................. 427/82; 148/6.14 R; 148/63; 357/52; 423/624; 423/617; 423/593; 427/87; 427/435; 427/430 B
[58] Field of Search ................ 148/6.14, 6.3; 423/593, 423/617, 624; 427/82, 435, 87, 430 B

[56] References Cited

U.S. PATENT DOCUMENTS

| | | | |
|---|---|---|---|
| 2,974,075 | 3/1961 | Miller | 148/6.3 |
| 3,290,180 | 12/1966 | Baird et al. | 148/6.3 |
| 3,372,067 | 3/1968 | Schafer | 148/6.3 |
| 3,380,852 | 4/1968 | Goetzberger | 148/6.3 |
| 3,413,160 | 11/1968 | Teumac | 148/6.14 R |
| 3,447,958 | 6/1969 | Okutsu et al. | 148/6.3 |
| 3,462,323 | 8/1969 | Groves | 427/82 |
| 3,525,650 | 8/1970 | Pammer et al. | 148/6.14 R |
| 3,798,139 | 3/1974 | Schwartz | 204/56 R |
| 3,914,465 | 10/1975 | Dyment et al. | 427/82 |
| 3,922,774 | 12/1975 | Lindmayer et al. | 148/6.3 |

FOREIGN PATENT DOCUMENTS

47-13871 7/1972 Japan ........................................ 427/82

OTHER PUBLICATIONS

Rubenstein, "The Oxidation of GaP and GaAs", Journal of Electrochemical Society, Jun. 1966, pp. 540–542.
Deal, "The Oxidation of Silicon in Dry Oxygen, Wet Oxygen, and Steam", Journal of Electrochemical Society, Jun. 1963, pp. 527–533.
Phillips et al., "Gallium-Arsenide-Phosphide MIS Capacitor Fabrication and Radiation Studies", Univ. of New Mexico, Eng. Research, 5-1972.
Bremmer et al., C.A. 69, 92535d (1968).
Mironov et al., C.A. 74, 147362f (1971).
Sommer, C.A. 75, 115,482z (1971).

*Primary Examiner*—John D. Smith
*Attorney, Agent, or Firm*—Hill, Van Santen, Steadman, Chiara & Simpson

[57] ABSTRACT

A method of manufacturing an oxide layer of semiconductor composition is disclosed.

On the surface portion of semiconductor substrate, an oxide layer is formed by oxidizing it in heated water containing oxygen gas, such, for example, as ozone. One preferred method is to bubble the ozone through hot water which contains near saturated steam at the temperature of the water.

9 Claims, 1 Drawing Figure

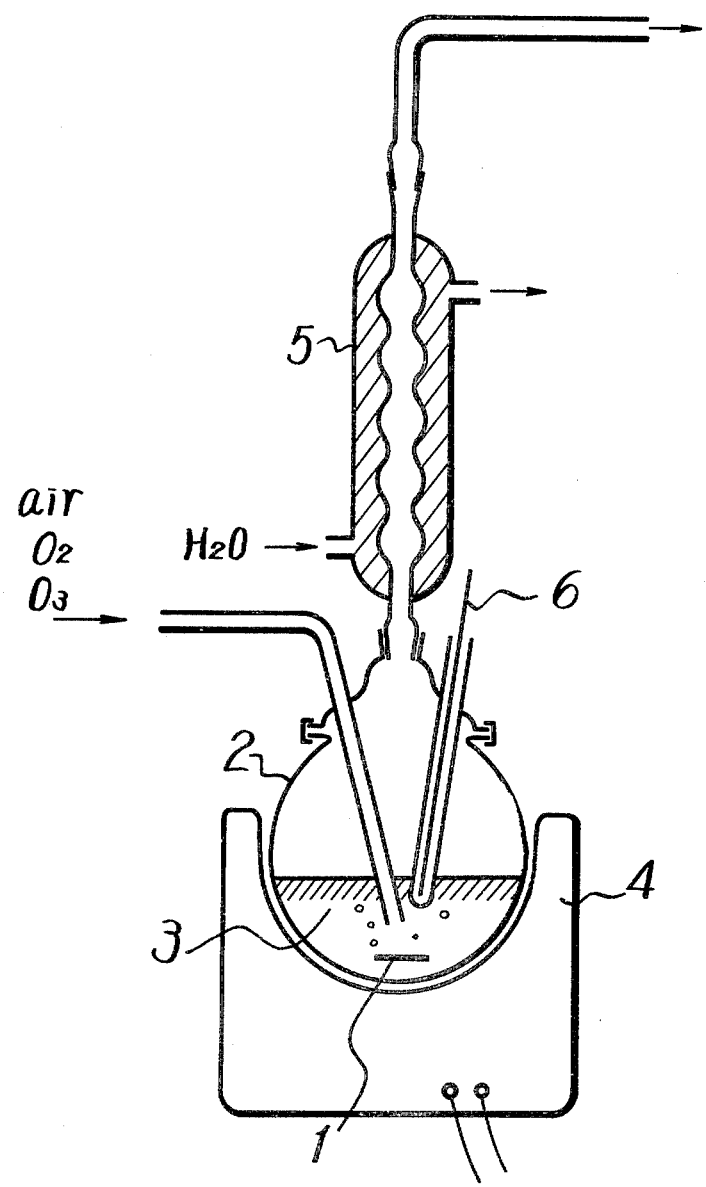

METHOD FOR MANUFACTURING AN OXIDE OF SEMICONDUCTOR

BACKGROUND OF THE INVENTION

1. Field of the Invention

This invention relates to a method of forming an oxide layer on a semiconductor composition in heated water containing oxygen.

2. Description of the Prior Art

It is well known that an oxide layer may be formed on a surface of a semiconductor substrate by oxidizing thermally, anodically, using plasma or by hot hydrogen peroxide.

Thermal and plasma oxidizing methods need to be treated in relatively heated circumstances, for example, when the temperatures are higher than 500° C., they are apt to introduce impurities such as Si, Cr or Fe into the oxide from a quartz support on which the semiconductor substrate is treated.

Oxidizing methods anodically and using hot hydrogen peroxide are treated in relatively low temperature circumstances, for example, lower than 500° C. But they need technical proficiencies because of such complicated processes as addition of reagent, control of pH (hydrogen ion concentration) and formation of electrodes. Moreover, it isn't economical so they need careful control of purity of reagent which causes electrical characteristics of the device to be very unstable, and need special apparatus. And, it is difficult to form reproducibly oxide layer thicker than 1 μm by the latter two methods.

SUMMARY OF THE INVENTION

The present invention comprises a novel method for manufacturing a compound semiconductor device having an oxide layer formed on a semiconductor composition.

Another object of this invention is to provide an improved method of manufacturing a semiconductor device having good passivation coating layer.

Still another object of this invention is to provide an improved method for forming a passivation layer on a semiconductor substrate suitable for use as a gate of an insulated gate field effect transistor.

BRIEF DESCRIPTION OF THE DRAWING

The single FIGURE is a schematic sketch of an apparatus which can be used for the purpose of carrying out the method of the present invention.

DESCRIPTION OF THE PREFERRED EMBODIMENTS

This invention relates to a method for manufacturing an oxide layer on a semiconductor composition, and particularly, it provides a method for forming a gate insulator or a passivation coating of a semiconductor device.

The present invention provides an improvement over conventional methods of oxidizing compound semiconductors.

A method for manufacturing an oxide layer on a compound semiconductor according to this invention, comprises the steps of immersing a compound semiconductor substrate, for example, GaAs, in heated or room-temperature water, of dissolving oxygen gas continuously in the water at least as much as the maximum solubility of oxygen gas at the temperature of the water, and of forming an oxide on the semiconductor substrate having a predetermined thickness on the surface thereof.

In the method according to this invention, the temperature of the water is between room-temperature and 100° C. in the case where there is no additional pressure and between 100° C. and 500° C. in the case where pressure is added. Therefore, it is an easy and safe process, because the method is performed at relatively low temperature and does not need either a reagent or a special apparatus.

In order to dissolve oxygen in gaseous form in water, an oxidizing gas such as oxygen ($O_2$), ozone ($O_3$) or air is blown into the water continuously. Pressure may be applied to the interior of a container containing both water and the oxidizing gas such as oxygen, ozone or air. Moreover, in order to increase the rate of oxidization, a catalyst such as Pt or Au may be used in contact with the semiconductor substrate in the container.

Thus, according to this invention, since no reagent is used except highly pure oxygen gas and water which can be obtained relatively easily, it is very easy to control the purity of such in the oxidizing apparatus. Moreover, since special apparatus is not used and since the process is very simple, it does not need any technical proficiency to carry out the operation.

Embodiments of this invention will be described with reference to the single FIGURE of the drawing by reference to experiments which were conducted.

A first experiment relating to this invention will now be described with reference to the drawing.

A semiconductor compound substrate 1, for example, GaAs, is immersed in water 3 in a separable flask 2, which is heated to about 100° C. with a mantle heater 4. Oxygen, ozone or air is then blown into the flask 2. Thereupon, an oxide layer is formed on the semiconductor composition. An oxide layer of about 1000 Å thickness is formed on the surface of the semiconductor substrate 1 in a few decade minutes.

Where the temperature of the water and the concentration of dissolved gas are constant, $O_3$, $O_2$ and air produce progressively lower oxidizing rates. Further, the higher temperature of the water, the faster oxidizing rate.

The breakdown voltage of an oxide layer of 2000 Å thickness is about 200 V. When the oxide layer is annealed under $N_2$ gas at a temperature of 250° C. for 2.5 hours, the breakdown voltage doesn't change especially. When it is annealed at a temperature of 480° C., the breakdown voltage is increased to between 270 V and 300 V.

As shown in the drawing, in order to prevent water from decreasing due to evaporation, any gas such as air or steam being exhausted from the flask 2, is cooled by a condensor 5 and exhausted from the top of the condenser 5. In addition, in order to know the temperature of water 3, a thermometer 6 is put into the separable flask 2.

A second experiment relating to this invention will now be described.

After a semiconductor compound substrate, for example, GaAs is immersed in 200 ml of water in an autoclave (not shown), and sufficient mixture of gas of $O_3$ and $O_2$ is substituted for air, the autoclave is sealed. Next, the autoclave is heated and kept at about 200° C., and the inside pressure is kept at about 10 kg/cm² (maximum 11.3 kg/cm$^2$). The maximum pressure is determined by the strength of autoclave glass.

When the substrate is cooled after 5 hours, there will be found on the substrate an oxide layer of several thousands Å in thickness.

In this case, even when water is stirred or not, the oxidizing rate is constant. Accordingly, the effect of stirring appears to have little effect on the oxidizing rate.

In addition, when the substrate is treated at the temperature of 100° C. in the same way as at 200° C., the oxidizing rate is observed to be slower than that of the case of 200° C.

A third experiment relating to this invention will now be described with reference to the drawings. A semiconductor compound substrate, for example, GaAs is treated for 6 hours in contact with a catalyst, for example, a noble metal such as Pt or Au in the same apparatus as in the first embodiment. The catalyst may be made of Pt in the form of a cage (not shown). Thus, the thickness of oxide formed comes up to several microns, and the oxidizing rate is faster than that of the case of the first embodiment without using a catalyst. In order to ascertain that both the concentration of oxygen gas dissolved in water and the usage of water play important parts in the formation of oxide layer of semiconductor composition, various experiments are made as set forth below.

A fourth experiment relating to this invention will now be described with reference to the drawing. When the substrate is boiled in water for 6 hours with no gas blowing into the water in the same apparatus as in the first embodiment, an oxide layer is not formed.

A fifth experiment was as follows. When the substrate is boiled in water for 6 hours with N$_2$ gas being blown into the water in the same apparatus as in the first embodiment, no oxide layer is formed.

A sixth experiment is described as follows. After a semiconductor compound substrate, for example GaAs is inserted in a quartz tube (not shown), ozone is bubbled through hot water. It contains near saturated steam at the temperature of the water. It is then carried to the substrate. Various experiments were made under the following heating conditions:

|     | Temperature of ozone (°C.) | Time (hour) |
| --- | --- | --- |
| (a) | 140° ± 15° C. | 6 |
| (b) | 200° ± 15° C. | 4 |
| (c) | 340° ± 15° C. | 3 |

Sample (a) results in the formation of oxide around the substrate. Sample (b) results in the formation of oxide on only portions where drops of water seem to adhere. Sample (c) results in no formation of an oxide.

A seventh experiment will now be described. A semiconductor compound substrate, for example, GaAs is boiled with ozone gas being blown into various kinds of alcohol instead of into water in the same apparatus as in the first experiment under the following conditions:

|     | Alcohol (b.p.) |  | Time |
| --- | --- | --- | --- |
| (a) | normal buthyl alcohol | (117° C.) | 3 hours |
| (b) | cyclohexanol | (162° C.) | 2.5 |
| (c) | normal octyl alcohol | (194° C.) | 1.5 |
| (d) | glycerin | (290° C.) | 3 |

Although oxide is partially formed on the sample (d), no oxide was formed on the others.

As is indicated between methods 4 and 7, it's important factors are that a substrate be immersed in water completely and that oxidizing gas such as O$_2$, O$_3$ or air be dissolved into water as much as the maximum solubility of the gas at the temperature of the water.

It will be apparent to those skilled in the art that many modifications and variations may be effected without departing from the spirit and scope of the novel concepts of the present invention.

I claim as my invention:

1. The method of manufacturing an oxide layer of semiconductor composition, comprising the steps of immersing a semiconductor compound substrate in heated water, and blowing an oxidizing gas in said water to dissolve at least as much as the maximum solubility of oxidizing gas at the temperature of said water between room temperature to boiling temperature.

2. The method according to claim 1, in which said semiconductor compound substrate is gallium arsenide.

3. The method according to claim 1, in which a noble metal is used in contact with said substrate.

4. The method according to claim 3, in which said catalyst is platinum.

5. The method according to claim 3, in which said catalyst is gold.

6. The method according to claim 1, in which said oxidizing gas is oxygen.

7. The method according to claim 1, in which said oxidizing gas is ozone.

8. The method of manufacturing an oxide layer of semiconductor composition comprising the steps of immersing a semiconductor compound substrate composed of GaAs in heated water, and dissolving an oxidizing gas in said water at least as much as the maximum solubility of oxidizing gas at the temperature of said water.

9. The method of manufacturing an oxide layer of semiconductor composition comprising the steps of immersing a semiconductor compound substrate in water in a pressure vessel, replacing the air in said pressure vessel by an oxydizing gas, sealing said pressure vessel, heating said pressure vessel to dissolve said oxidizing gas in said water at least as much as the maximum solubility of oxidizing gas at the temperature of said water in the range of 100° C.-500° C.

* * * * *